(12) United States Patent
Tan

(10) Patent No.: US 10,978,665 B1
(45) Date of Patent: Apr. 13, 2021

(54) DISPLAY PANEL AND DISPLAY PANEL MANUFACTURING METHOD

(71) Applicant: Shenzhen China Star Optoelectronics Semiconductor Display Technology Co., Ltd., Guangdong (CN)

(72) Inventor: Wei Tan, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 16/627,782

(22) PCT Filed: Dec. 27, 2019

(86) PCT No.: PCT/CN2019/129158
§ 371 (c)(1),
(2) Date: Dec. 31, 2019

(30) Foreign Application Priority Data

Dec. 17, 2019 (CN) .......................... 201911303413.6

(51) Int. Cl.
| | |
|---|---|
| *H01L 29/08* | (2006.01) |
| *H01L 51/52* | (2006.01) |
| *H01L 27/32* | (2006.01) |
| *H01L 51/50* | (2006.01) |
| *H01L 51/56* | (2006.01) |

(52) U.S. Cl.
CPC ...... *H01L 51/5228* (2013.01); *H01L 27/3246* (2013.01); *H01L 51/5072* (2013.01); *H01L 51/5206* (2013.01); *H01L 51/56* (2013.01); *H01L 2227/323* (2013.01); *H01L 2251/308* (2013.01)

(58) Field of Classification Search
CPC ............. H01L 51/5228; H01L 51/5012; H01L 51/5056; H01L 51/5206; H01L 27/3246
See application file for complete search history.

(56) References Cited

U.S. PATENT DOCUMENTS

| | | | |
|---|---|---|---|
| 2014/0186978 A1* | 7/2014 | Kang | .................. H01L 51/5088 438/23 |
| 2016/0211316 A1* | 7/2016 | Oh | .......................... H01L 51/56 |
| 2017/0141169 A1* | 5/2017 | Sim | ...................... H01L 27/3265 |
| 2020/0212162 A1* | 7/2020 | Fan | ...................... H01L 51/5228 |

* cited by examiner

*Primary Examiner* — Phuc T Dang
(74) *Attorney, Agent, or Firm* — Mark M. Friedman

(57) ABSTRACT

The present invention discloses a display panel and a display panel manufacturing method. The display panel includes: a substrate; a pixel definition layer including an auxiliary electrode and a pixel electrode layer disposed at an interval; electron transport layer; a cathode layer; organic layer; an OLED light emitting layer; an insulation column disposed on the auxiliary electrode; and a metal layer disposed on a first side of the insulation column; wherein the cathode layer is connected electrically to the auxiliary electrode through the metal layer.

20 Claims, 4 Drawing Sheets

DISPLAY PANEL AND DISPLAY PANEL MANUFACTURING METHOD

FIELD OF INVENTION

The present invention relates to a field of display technologies, especially relates to a display panel and a display panel manufacturing method.

BACKGROUND OF INVENTION

An organic light emitting diode (OLED) device has advantages such as self-luminescence, full solid state, low driving voltage, high light emitting efficiency, fast response times, high sharpness and contrast, angle of view near 180°, wide operating temperature, and achievement of flexible display and large area full color display, and is therefore recognized in the industries as the most promising display device.

At present, small-sized OLED displays comprehensively overwhelms liquid crystal displays (LCDs) in fields of mobiles and vehicles. In the future, large-sized top emission OLED display panels with high resolutions will be applied and replace LCD display panel entirely. A light emitting principle of OLED display device is that under driving of an electrical field, a semiconductor material and an organic light emitting material emit light through injection and complexing of carriers. A conventional OLED display panel usually comprises a thin film transistor (TFT) substrate, an anode disposed on the TFT substrate, an organic light emitting layer disposed on the anode, and a cathode disposed on the organic light emitting layer, because the OLED display panel is a structure including a common cathode. The common cathode of the top emission OLED is usually made of metal or transparent conductive oxide (TCO) with high transmittance.

SUMMARY OF INVENTION

Technical Issue

A metal cathode with a high transmittance has an issue that an area resistance thereof is excessive high, and for a large-sized OLED display panel with the common cathode of the high area resistance, a serious power voltage drop (IR-drop) exists and results in poor uniformity of brightness inside the surface.

Technical Solution the embodiment of the present invention provides a display panel and display panel manufacturing method to solve the technical issue that for a large-sized OLED display panel with the common cathode of the high area resistance, a serious power voltage drop exists and results in poor uniformity of brightness inside the surface.

To solve the above issue, in a first aspect, the embodiment of the present invention provides a display panel, and the display panel comprises:

a substrate;

a pixel definition layer disposed on the substrate, and the pixel definition layer comprising an auxiliary electrode and a pixel electrode layer disposed at an interval;

an electron transport layer disposed on the pixel definition layer;

a cathode layer disposed on the electron transport layer;

an organic layer disposed on the cathode layer;

an organic light emitting diode (OLED) light emitting layer disposed on the pixel electrode layer;

an insulation column disposed on the auxiliary electrode; and a metal layer disposed on a first side of the insulation column;

wherein the cathode layer is connected electrically to the auxiliary electrode through the metal layer.

In some embodiments of the present invention, a first end of the metal layer is connected to the auxiliary electrode, and a second end of the metal layer is connected to the cathode layer.

In some embodiments of the present invention, the insulation column further comprises a second side opposite to the first side, and the second side of the insulation column is disposed with the electron transport layer and the organic layer.

In some embodiments of the present invention, the first side of the insulation column is a side away from the OLED light emitting layer, the second side of the insulation column is a side near the OLED light emitting layer.

In some embodiments of the present invention, a surface area of the insulation column away from the auxiliary electrode is greater than a surface area of the insulation column connected to the auxiliary electrode, a height of the insulation column is greater than a height of a surface of the organic layer, and a shape of a cross-section of the insulation column is an inverted trapezoid.

In some embodiments of the present invention, a material of the organic layer is a conductor pattern material, a material of the metal layer is a conductor electrode material, and the conductor pattern material and the conductor electrode material exclude each other.

In some embodiments of the present invention, the pixel electrode layer comprises a first indium tin oxide layer, a silver layer, and a second indium tin oxide layer that are stacked sequentially on one another.

In some embodiments of the present invention, the pixel definition layer comprises a first restricted region and a second restricted region, the insulation column is disposed in the first restricted region, and the OLED light emitting layer is disposed in the second restricted region.

In a second aspect, the embodiment of the present invention also provides a display panel manufacturing method, the manufacturing method comprises steps as follows:

manufacturing a pixel definition layer on a substrate surface, wherein the pixel definition layer comprises an auxiliary electrode and a pixel electrode layer disposed at an interval;

manufacturing an insulation column on the auxiliary electrode surface, and manufacturing an organic light emitting diode (OLED) light emitting layer on a surface of the pixel electrode layer;

manufacturing an electron transport layer on a surface of the pixel definition layer;

manufacturing a cathode layer on a surface of the electron transport layer;

manufacturing an organic layer on a surface of the electron transport layer; and evaporating a metal layer on a side of the insulation column such that the cathode layer is connected electrically to the auxiliary electrode through the metal layer to acquire the display panel.

In some embodiments of the present invention, the steps of manufacturing the electron transport layer, the cathode layer, and the organic layer include employing a first evaporation line source to perform evaporation, and the first evaporation line source comprises an evaporation angle adjusting mechanism.

In some embodiments of the present invention, the evaporation angle adjusting mechanism comprises a pivot shaft and a mask, the mask is fastened by the pivot shaft to shield a part of an outlet of the first evaporation line source.

In some embodiments of the present invention, the step of evaporating the metal layer further includes employing a second evaporation line source to perform evaporation, the second evaporation line source is a line source with a constant evaporation angle.

In some embodiments of the present invention, the display panel comprises: a substrate; a pixel definition layer disposed on the substrate, and the pixel definition layer comprising an auxiliary electrode and a pixel electrode layer disposed at an interval; an electron transport layer disposed on the pixel definition layer; a cathode layer disposed on the electron transport layer; an organic layer disposed on the cathode layer; an organic light emitting diode (OLED) light emitting layer disposed on the pixel electrode layer; an insulation column disposed on the auxiliary electrode; and a metal layer disposed on a first side of the insulation column; wherein the cathode layer is connected electrically to the auxiliary electrode through the metal layer.

In some embodiments of the present invention, a first end of the metal layer is connected to the auxiliary electrode, and a second end of the metal layer is connected to the cathode layer.

In some embodiments of the present invention, the insulation column further comprises a second side opposite to the first side, and the second side of the insulation column is disposed with the electron transport layer and the organic layer.

In some embodiments of the present invention, the first side of the insulation column is a side away from the OLED light emitting layer, the second side of the insulation column is a side near the OLED light emitting layer.

In some embodiments of the present invention, a surface area of the insulation column away from the auxiliary electrode is greater than a surface area of the insulation column connected to the auxiliary electrode, a height of the insulation column is greater than a height of a surface of the organic layer, and a shape of a cross-section of the insulation column is an inverted trapezoid.

In some embodiments of the present invention, a material of the organic layer is a conductor pattern material, a material of the metal layer is a conductor electrode material, and the conductor pattern material and the conductor electrode material exclude each other.

In some embodiments of the present invention, the pixel electrode layer comprises a first indium tin oxide layer, a silver layer, and a second indium tin oxide layer that are stacked sequentially on one another.

In some embodiments of the present invention, the pixel definition layer comprises a first restricted region and a second restricted region, the insulation column is disposed in the first restricted region, and the OLED light emitting layer is disposed in the second restricted region.

Advantages

Compared to the prior art, the present invention, by evaporating the metal layer on a side of the insulation column, electrically connects the cathode layer to the auxiliary electrode through the metal layer such that reduction of a power voltage drop of the display panel is achieved by lowering a resistance of the cathode layer to further improve uniformity of brightness of the display panel and enhance a production rate and a yield rate of the products.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
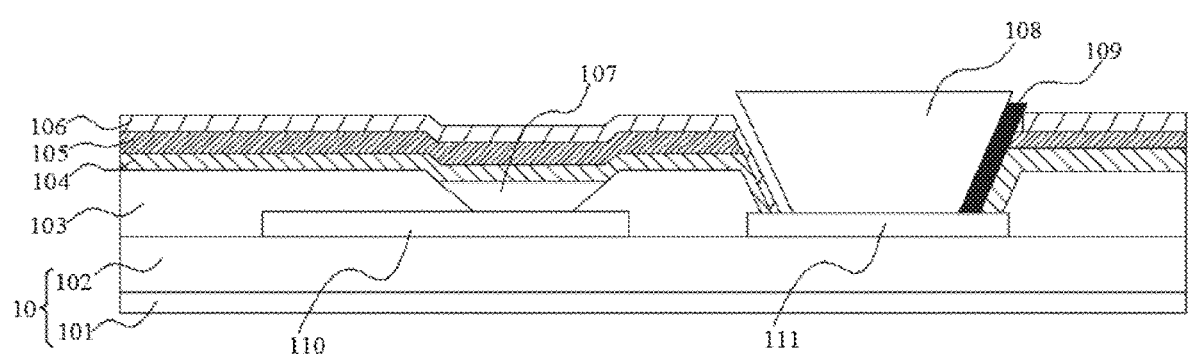
FIG. 1 is a schematic structural view of a display panel of an embodiment of the present invention.

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

In the description of the present invention, it should be noted that unless clear rules and limitations otherwise exist, terminologies "install", "connect", "connection" should be understood in a broad sense. For instance, the connection can be a fixed connection, a detachable connection or an integral connection. The connection can be a mechanical connection, an electrical connection or a telecommunication. The connection can be a direct connection, an indirect connection through an intermedium, can be an internal communication between two elements or an interaction between the two elements. For a person of ordinary skill in the art, the specific meaning of the above terminology in the present invention can be understood on a case-by-case basis.

The following disclosure provides many different embodiments or examples to achieve different structures of the present invention. To simplify the disclosure of the present invention, the components and arrangements of the specific examples are described below. Of course, they are merely examples, and the purpose is not to limit the present invention. Furthermore, the present invention may repeat reference numerals and/or reference letters in different examples. The repetition is for the purpose of simplification and clarity, and does not by itself indicate the relationship between the various embodiments and/or settings discussed. In addition, the present invention provides examples of various specific processes and materials, but a person of ordinary skill in the art can be aware of the application of other processes and/or the use of other materials.

In the prior art, a metal cathode with a high transmittance has an issue that an area resistance thereof is excessive high, and for a large-sized organic light emitting diode (OLED) display panel with the common cathode of the high area resistance, a serious power voltage drop (IR-drop) exists and results in poor uniformity of brightness inside the surface.

Accordingly, the embodiment of the present invention provides a display panel and a display panel manufacturing method. Detailed description will be presented as follows.

First, the embodiment of the present invention provides a a display panel, as shown in FIG. 1, FIG. 1 is a schematic structural view of a display panel of an embodiment of the present invention. The display panel comprises: a substrate 10; pixel definition layer 103 disposed on the substrate 10, wherein the pixel definition layer 103 comprises an auxiliary electrode 111 and a pixel electrode layer 110 disposed at an interval; an electron transport layer 104 disposed on the pixel definition layer 103; a cathode layer 105 disposed on the electron transport layer 104; an organic layer 106 disposed on the cathode layer 105; an OLED light emitting layer 107 disposed on the pixel electrode layer 110; an insulation column 108 disposed on the auxiliary electrode 111; and a metal layer 109 disposed on a first side of the insulation column 108, wherein the cathode layer 105 is connected electrically to the auxiliary electrode 111 through the metal layer 109.

Compared to the prior art, the present invention, by evaporation the metal layer 109 on a side of the insulation column 108, electrically connects the cathode layer 105 to the auxiliary electrode 111 through the metal layer 109 such that reduction of a power voltage drop of the display panel is achieved by lowering a resistance of the cathode layer 105 to further improve uniformity of brightness of the display panel and enhance a production rate and a yield rate of the products.

On the basis of the above embodiment, in another embodiment of the present invention, as shown in FIG. 1, a first end of the metal layer 109 is connected to the auxiliary electrode 111, and a second end of the metal layer 109 is connected to the cathode layer 105. In the present embodiment, to achieve electrical connection of the cathode layer 105 with the auxiliary electrode 111, the metal layer 109 is employed to bridge the cathode layer 105 and the auxiliary electrode 111. The cathode layer 105, the metal layer 109, and the auxiliary electrode 111 commonly forma common cathode. Compared to the single cathode layer 105, a resistance of the common cathode becomes smaller and can achieve reduction of a power voltage drop of the display panel to improve uniformity of brightness of the display panel.

In another embodiment of the present invention, a surface area of the insulation column 108 away from the auxiliary electrode 111 is greater than a surface area of the insulation column 108 connected to the auxiliary electrode 111. A shape of a cross-section of the insulation column 108 is an inverted trapezoid. Moreover, a height of the insulation column 108 is greater than a height of a surface of the organic layer 106. When the first evaporation line source in the present embodiment is cooperated, it can be prevented that the first evaporation line source is coated fully on two sides of the insulation column 108 such that when the electron transport layer 104, the cathode layer 105, and the organic layer 106 are manufactured, a gap is left on at least one side of the insulation column 108.

On the basis of the above embodiment, in the present embodiment, the insulation column 108 further comprises a second side opposite to the first side. The second side of the insulation column 108 is disposed with the electron transport layer 104 and the organic layer 106. The first side of the insulation column 108 is a side away from the OLED light emitting layer 107, and the second side of the insulation column 108 is a side near the OLED light emitting layer 107. The first side of the insulation column 108 is disposed with the metal layer 109, and the second side of the insulation column 108 is disposed with the electron transport layer 104 and the organic layer 106. The insulation column 108 is configured to isolate the cathode layer 105. The insulation column 108 is made of three layers of inorganic films (silicon nitride-silicon dioxide-silicon nitride).

In the present embodiment, the substrate 10 comprises a glass substrate 101 and a array substrate 102. It can be understood that, in other embodiment, the substrate 10 can also include other substrate, which will not be described repeatedly herein.

In the present embodiment, the pixel electrode layer 110 comprises a first indium tin oxide (ITO) layer, a silver (Ag) layer, and a second indium tin oxide (ITO) layer that are stacked sequentially on one another.

In the present embodiment, the pixel definition layer 103 comprises two sunken restricted regions, which are a first restricted region and a second restricted region. The insulation column 108 is disposed in the first restricted region, and the OLED light emitting layer 107 is disposed in the second restricted region.

A material of the organic layer 106 is a conductor pattern material (CPM), a material of the metal layer 109 is conductor electrode material (CEM), the conductor pattern material is a low temperature organic material, and the conductor electrode material is a metal. The conductor pattern material and the conductor electrode material in the present embodiment are both from the OTI Lumionics company.

Because the conductor pattern material and the conductor electrode material has excluding characteristics to each other, in a practical production, the organic layer 106 can be deposited first, and then the metal layer 109 is deposited later. Because the two exclude each other, the metal layer 109 has a self-assembled process, the metal layer 109 is only deposited on a region not covering the organic layer 106, in other words, the metal layer 109 completes its patterning in a negative pattern of the organic layer 106. An evaporation temperature of the organic layer 106 is 150-250° C., and an evaporation temperature of the metal layer 109 is 500-650° C.

To better acquire the display panel in the embodiment of the present invention, on the basis of the display panel, the embodiment of the present invention also provides a display panel manufacturing method, the manufacturing method for manufacturing the display panel in the above embodiment.

Figure 2:
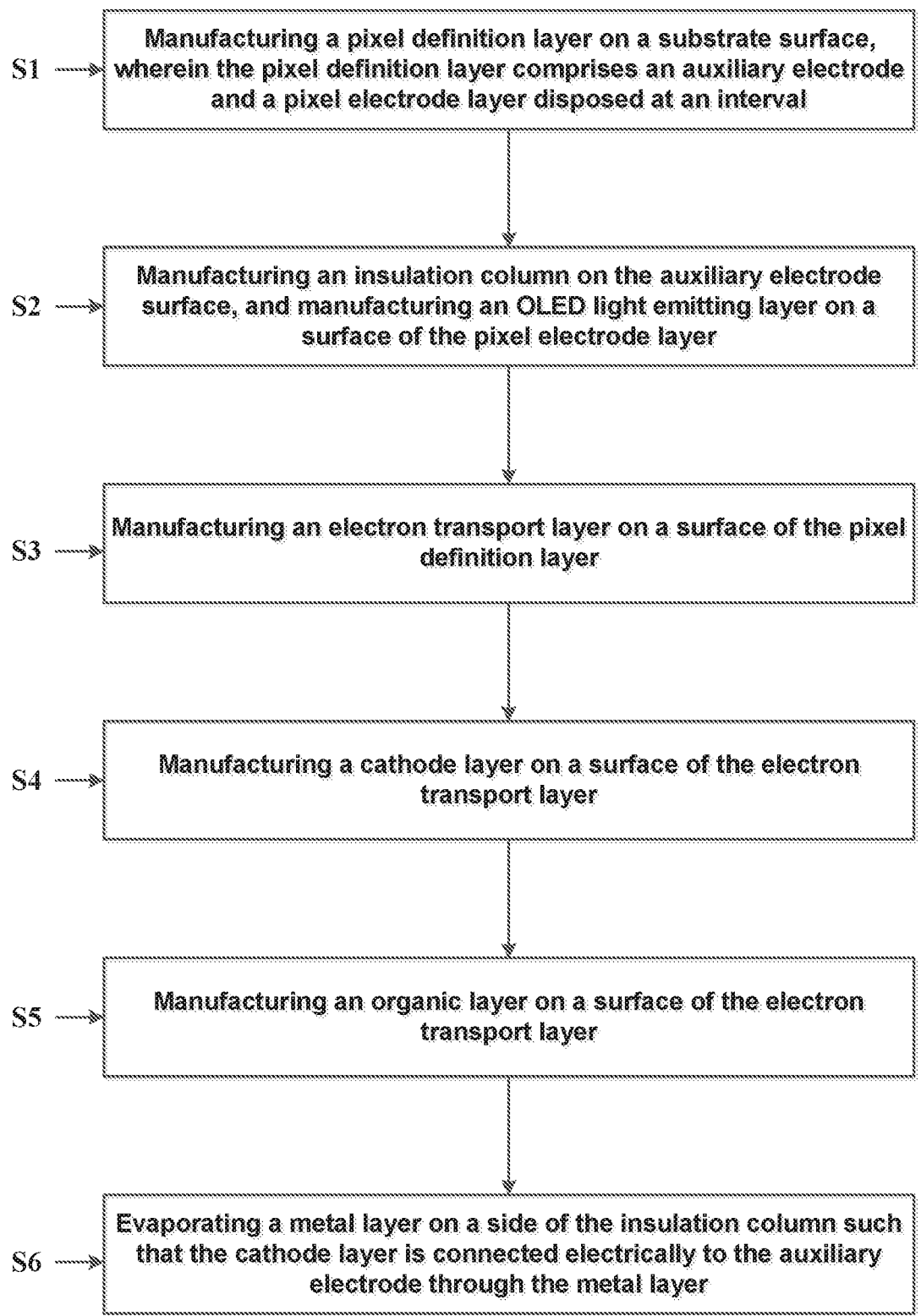
FIG. 2 is a flowchart of a display panel manufacturing method in an embodiment of the present invention.

With reference to FIG. 2, FIG. 2 is a flowchart of a display panel manufacturing method in an embodiment of the present invention. The manufacturing method comprises steps S1 to S6 as follows.

The step S1 comprises manufacturing a pixel definition layer 102 on a surface of a substrate 10. The pixel definition layer 102 comprises an auxiliary electrode 111 and a pixel electrode layer 110 disposed at an interval.

The step S2 comprises on a surface of the auxiliary electrode 111 manufacturing an insulation column 108, on a surface of the pixel electrode layer manufacturing an OLED light emitting layer 107.

The step S3 comprises manufacturing an electron transport layer 104 on a surface of the pixel definition layer 102.

The step S4 comprises manufacturing an cathode layer 105 on a surface of the electron transport layer 104.

The step S5 comprises manufacturing an organic layer 106 on a surface of the electron transport layer 105.

The step S6 comprises evaporating a metal layer 109 on a side of the insulation column 108 such that the cathode layer 105 is connected electrically to the auxiliary electrode 111 through the metal layer 109.

Figure 3:
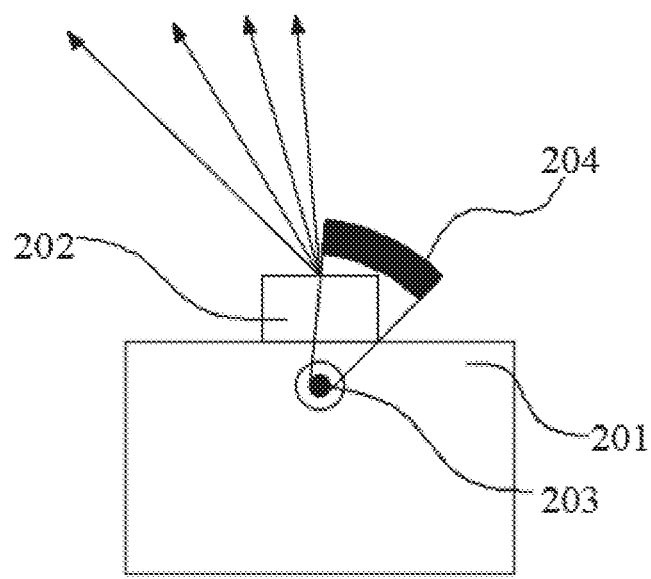
FIG. 3 is a schematic structural view of a first evaporation line source in an embodiment of the present invention.
Figure 4:
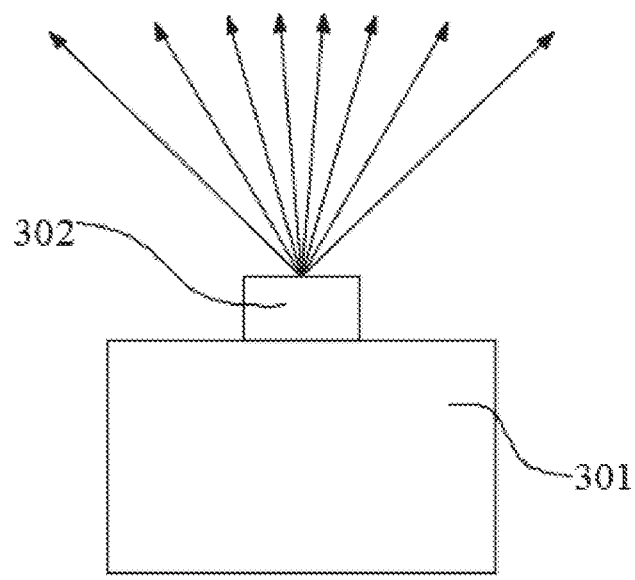
FIG. 4 is a schematic structural view of a second evaporation line source in an embodiment of the present invention.

Specifically, the steps S3-S5 of manufacturing the electron transport layer 104, the cathode layer 105, and the organic layer 106 include employing a first evaporation line source to perform evaporation, as shown in FIG. 3, FIG. 3 is a schematic structural view of a first evaporation line source in an embodiment of the present invention. The first evaporation line source comprises an evaporation angle adjusting mechanism. The step S6 of evaporating the metal layer includes employing a second evaporation line source to perform evaporation, as shown in FIG. 4, FIG. 4 is a schematic structural view of a second evaporation line source in an embodiment of the present invention. The second evaporation line source is a line source with a constant evaporation angle.

The first evaporation line source comprises a reaction chamber 201, an evaporation outlet 202, and an evaporation angle adjusting mechanism. The evaporation angle adjusting mechanism comprises a pivot shaft 203 and a mask 204, the mask 204 is fastened on the reaction chamber 201 by the pivot shaft 203 and is configured to shield a part of the evaporation outlet 202 of the first evaporation line source. The mask 204 can also change a shielding angle by pivoting. The second evaporation line source comprises a reaction chamber 301 and an evaporation outlet 302, the second evaporation line source can proceed with the evaporation along a fixed angle as shown in FIG. 4.

In the above-mentioned embodiments, the descriptions of the various embodiments are focused. For the details of the embodiments not described, reference may be made to the related descriptions of the other embodiments The embodiments of the present invention are described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A display panel, comprising:
   a substrate;
   a pixel definition layer disposed on the substrate, and the pixel definition layer comprising an auxiliary electrode and a pixel electrode layer disposed at an interval;
   an electron transport layer disposed on the pixel definition layer;
   a cathode layer disposed on the electron transport layer;
   an organic layer disposed on the cathode layer;
   an organic light emitting diode (OLED) light emitting layer disposed on the pixel electrode layer;
   an insulation column disposed on the auxiliary electrode; and
   a metal layer disposed on a first side of the insulation column;
   wherein the cathode layer is connected electrically to the auxiliary electrode through the metal layer.

2. The display panel as claimed in claim 1, wherein a first end of the metal layer is connected to the auxiliary electrode, and a second end of the metal layer is connected to the cathode layer.

3. The display panel as claimed in claim 2, wherein the insulation column further comprises a second side opposite to the first side, and the second side of the insulation column is disposed with the electron transport layer and the organic layer.

4. The display panel as claimed in claim 3, wherein the first side of the insulation column is a side away from the OLED light emitting layer, the second side of the insulation column is a side near the OLED light emitting layer.

5. The display panel as claimed in claim 1, wherein a surface area of the insulation column away from the auxiliary electrode is greater than a surface area of the insulation column connected to the auxiliary electrode, a height of the insulation column is greater than a height of a surface of the organic layer, and a shape of a cross-section of the insulation column is an inverted trapezoid.

6. The display panel as claimed in claim 1, wherein a material of the organic layer is a conductor pattern material, a material of the metal layer is a conductor electrode material, and the conductor pattern material and the conductor electrode material exclude each other.

7. The display panel as claimed in claim 1, wherein the pixel electrode layer comprises a first indium tin oxide layer, a silver layer, and a second indium tin oxide layer that are stacked sequentially on one another.

8. The display panel as claimed in claim 1, wherein the pixel definition layer comprises a first restricted region and a second restricted region, the insulation column is disposed in the first restricted region, and the OLED light emitting layer is disposed in the second restricted region.

9. A display panel manufacturing method, comprising steps as follows:
   manufacturing a pixel definition layer on a substrate surface, wherein the pixel definition layer comprises an auxiliary electrode and a pixel electrode layer disposed at an interval;
   manufacturing an insulation column on the auxiliary electrode surface, and manufacturing an organic light emitting diode (OLED) light emitting layer on a surface of the pixel electrode layer;
   manufacturing an electron transport layer on a surface of the pixel definition layer;

manufacturing a cathode layer on a surface of the electron transport layer;

manufacturing an organic layer on a surface of the electron transport layer; and evaporating a metal layer on a side of the insulation column such that the cathode layer is connected electrically to the auxiliary electrode through the metal layer to acquire the display panel.

10. The manufacturing method as claimed in claim 9, wherein the steps of manufacturing the electron transport layer, the cathode layer, and the organic layer include employing a first evaporation line source to perform evaporation, and the first evaporation line source comprises an evaporation angle adjusting mechanism.

11. The manufacturing method as claimed in claim 10, wherein the evaporation angle adjusting mechanism comprises a pivot shaft and a mask, the mask is fastened by the pivot shaft to shield a part of an outlet of the first evaporation line source.

12. The manufacturing method as claimed in claim 9, wherein the step of evaporating the metal layer further includes employing a second evaporation line source to perform evaporation, the second evaporation line source is a line source with a constant evaporation angle.

13. The manufacturing method as claimed in claim 9, wherein the display panel comprises: a substrate; a pixel definition layer disposed on the substrate, and the pixel definition layer comprising an auxiliary electrode and a pixel electrode layer disposed at an interval; an electron transport layer disposed on the pixel definition layer; a cathode layer disposed on the electron transport layer; an organic layer disposed on the cathode layer; an organic light emitting diode (OLED) light emitting layer disposed on the pixel electrode layer; an insulation column disposed on the auxiliary electrode; and a metal layer disposed on a first side of the insulation column; wherein the cathode layer is connected electrically to the auxiliary electrode through the metal layer.

14. The manufacturing method as claimed in claim 13, wherein a first end of the metal layer is connected to the auxiliary electrode, and a second end of the metal layer is connected to the cathode layer.

15. The manufacturing method as claimed in claim 14, wherein the insulation column further comprises a second side opposite to the first side, and the second side of the insulation column is disposed with the electron transport layer and the organic layer.

16. The manufacturing method as claimed in claim 15, wherein the first side of the insulation column is a side away from the OLED light emitting layer, the second side of the insulation column is a side near the OLED light emitting layer.

17. The manufacturing method as claimed in claim 13, wherein a surface area of the insulation column away from the auxiliary electrode is greater than a surface area of the insulation column connected to the auxiliary electrode, a height of the insulation column is greater than a height of a surface of the organic layer, and a shape of a cross-section of the insulation column is an inverted trapezoid.

18. The manufacturing method as claimed in claim 13, wherein a material of the organic layer is a conductor pattern material, a material of the metal layer is a conductor electrode material, and the conductor pattern material and the conductor electrode material exclude each other.

19. The manufacturing method as claimed in claim 13, wherein the pixel electrode layer comprises a first indium tin oxide layer, a silver layer, and a second indium tin oxide layer that are stacked sequentially on one another.

20. The manufacturing method as claimed in claim 13, wherein the pixel definition layer comprises a first restricted region and a second restricted region, the insulation column is disposed in the first restricted region, and the OLED light emitting layer is disposed in the second restricted region.

* * * * *